(12) United States Patent
Hedberg et al.

(10) Patent No.: US 7,059,267 B2
(45) Date of Patent: Jun. 13, 2006

(54) USE OF PULSED GROUNDING SOURCE IN A PLASMA REACTOR

(75) Inventors: Chuck E. Hedberg, Boise, ID (US); Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 545 days.

(21) Appl. No.: 10/219,841

(22) Filed: Aug. 14, 2002

(65) Prior Publication Data

US 2002/0189761 A1 Dec. 19, 2002

Related U.S. Application Data

(62) Division of application No. 09/649,748, filed on Aug. 28, 2000, now Pat. No. 6,485,572.

(51) Int. Cl.
*C23C 16/509* (2006.01)
*C23F 1/00* (2006.01)
*H01L 21/306* (2006.01)

(52) U.S. Cl. ............... 118/723 E; 118/723 ER; 156/345.43; 156/345.44; 156/345.45; 156/345.46; 156/345.47

(58) Field of Classification Search ............ 118/723 E, 118/723 ER; 156/345.43, 35.44, 345.45, 156/345.46, 345.47
See application file for complete search history.

(56) References Cited

U.S. PATENT DOCUMENTS

| | | | |
|---|---|---|---|
| 3,672,985 A | 6/1972 | Nathanson et al. | 438/52 |
| 3,860,507 A | 1/1975 | Vossen, Jr. | 204/192.12 |

(Continued)

FOREIGN PATENT DOCUMENTS

| | | |
|---|---|---|
| EP | 0 710 977 A1 | 5/1996 |
| EP | 0734046 | 9/1996 |
| JP | 64-073620 | 3/1989 |
| JP | 06053176 | 2/1994 |
| JP | 06-338476 | 12/1994 |
| JP | 07-283206 | 10/1995 |
| JP | 08-031596 | 2/1996 |
| JP | 08-045903 | 2/1996 |
| JP | 08-083776 | 3/1996 |
| JP | 08-124902 | 5/1996 |
| JP | 08-139077 | 5/1996 |
| JP | 09-260360 | 10/1997 |
| JP | 10-107012 | 4/1998 |
| JP | 10-270419 | 9/1998 |
| JP | 2000-188284 | 7/2000 |
| JP | 2000-223480 | 8/2000 |
| JP | 2000-224796 | 8/2000 |

OTHER PUBLICATIONS

Onuki et al., "Formation of W Underlayer by Switching Bias Sputtering to Plug 0.25Tm Contact Holes", J. Vac. Sci. technol. B 17(3), May/Jun. 1999, pps. 1028–1033.

Onuki et al., "High–Reliability Interconnection Formation by a Two–Step Switching Bias Sputtering Process", Thin Solid Films 266, Jun. 16, 1995, pps. 182–188.

Onuki et al., "Study on Step Coverage and (111) Preferred Orientation of Aluminum Film Deposited by a New Switching Bias Sputtering Method", Appl. Phys. Lett. 53(11), Jul. 19, 1998, pps. 968–980.

(Continued)

*Primary Examiner*—Rudy Zervigon
(74) *Attorney, Agent, or Firm*—TraskBritt

(57) ABSTRACT

A method for grounding a semiconductor substrate pedestal during a portion of a high voltage power bias oscillation cycle to reduce or eliminate the detrimental effects of feature charging during the operation of a plasma reactor.

2 Claims, 7 Drawing Sheets

U.S. PATENT DOCUMENTS

| | | | |
|---|---|---|---|
| 4,438,315 A | 3/1984 | Toyda et al. | 219/121.41 |
| 4,808,258 A | 2/1989 | Otsubo et al. | 438/710 |
| 5,315,145 A | 5/1994 | Lukaszek | 257/379 |
| 5,322,806 A | 6/1994 | Kohno et al. | 438/573 |
| 5,344,792 A | 9/1994 | Sandhu et al. | 438/660 |
| 5,352,324 A | 10/1994 | Gotoh et al. | 438/714 |
| 5,362,358 A | 11/1994 | Yamagata et al. | 156/345.42 |
| 5,378,311 A | 1/1995 | Nagayama et al. | 438/16 |
| 5,435,886 A | 7/1995 | Fujiwara et al. | 438/710 |
| 5,441,595 A | 8/1995 | Yamagata et al. | 438/701 |
| 5,460,684 A * | 10/1995 | Saeki et al. | 156/345.51 |
| 5,508,227 A | 4/1996 | Chan et al. | 438/798 |
| 5,520,740 A | 5/1996 | Kanai et al. | 118/718 |
| 5,527,391 A | 6/1996 | Echizen et al. | 118/719 |
| 5,545,258 A | 8/1996 | Katayama et al. | 118/723 MP |
| 5,614,060 A | 3/1997 | Hanawa | 438/720 |
| 5,705,081 A | 1/1998 | Inazawa et al. | 216/71 |
| 5,714,010 A | 2/1998 | Matsuyama et al. | 118/723 M |
| 5,810,982 A | 9/1998 | Sellers | 204/298.08 |
| 5,859,469 A | 1/1999 | Rynne | 257/592 |
| 5,869,877 A | 2/1999 | Patrick et al. | 257/429 |
| 5,917,286 A | 6/1999 | Scholl et al. | 315/111.21 |
| 6,051,114 A | 4/2000 | Yao et al. | 204/192.3 |
| 6,099,747 A | 8/2000 | Usami | 216/37 |
| 6,121,161 A | 9/2000 | Rossman et al. | 438/783 |
| 6,136,214 A | 10/2000 | Mori et al. | 216/67 |
| 6,201,208 B1 | 3/2001 | Wendt et al. | 219/121.41 |
| 6,214,160 B1 | 4/2001 | Dornfest et al. | 156/345.28 |
| 6,217,721 B1 | 4/2001 | Xu et al. | 204/192.17 |
| 6,218,196 B1 | 4/2001 | Ise et al. | 438/684 |
| 6,220,201 B1 | 4/2001 | Nowak et al. | 118/723 I |
| 6,231,777 B1 | 5/2001 | Kofuji et al. | 216/71 |
| 6,344,419 B1 | 2/2002 | Forster et al. | 438/758 |
| 6,544,895 B1 | 4/2003 | Donohoe | 438/706 |
| 6,589,437 B1 | 7/2003 | Collins | 216/68 |

OTHER PUBLICATIONS

Shur et al., "Surface Discharge Plasma Induced by Spontaneous Polarization Switching", Appl. Phys. Lett. 70(5), Feb. 3, 1997, pps. 574–576.

Suwa et al., "Influence of Silicon Concentration and Layering of Molybdenum Silicide on the Reliability of Ai–Si–Cu Interconnections", J. Vac. Sci. Technol. B 9(3), May/Jun. 1991, pps. 1487–1491.

Kofuji et al., "Reduction in the Local Charge Build Up with Electron Acceleration Pulse Bias", Dry Process Symposium, 1995, pp. 39–44.

International Search Report dated Mar. 28, 2002 (4 pages).

Patent Abstracts of Japan, 11224796, Aug. 1999, 1 page.

* cited by examiner

USE OF PULSED GROUNDING SOURCE IN A PLASMA REACTOR

CROSS-REFERENCE TO RELATED APPLICATION

This application is a divisional of application Ser. No. 09/649,748, filed Aug. 28, 2000, now U.S. Pat. No. 6,485,572, issued Nov. 26, 2002.

BACKGROUND OF THE INVENTION

1. Field of the Invention

The present invention relates to plasma reactor apparatus and processes. More specifically, the present invention relates to grounding a semiconductor substrate pedestal of a plasma reactor apparatus during a portion of a positive voltage power bias oscillation cycle to increase the energy of ion particles of the plasma to increase the feature charging effects regarding a substrate being etched using the plasma reactor.

2. State of the Art

Higher performance, lower cost, increased miniaturization of electronic components, and greater density of integrated circuits are ongoing goals of the computer industry. One commonly used technique to increase the density of integrated circuits involves stacking multiple layers of active and passive components one atop another to allow for multilevel electrical interconnection between devices formed on each of these layers. This multilevel electrical interconnection is generally achieved with a plurality of metal-filled vias ("contacts") extending through dielectric layers that separate the component layers from one another. These vias are generally formed by etching through each dielectric layer using etching methods known in the industry, such as plasma etching. Plasma etching is also used in the forming of a variety of features for the electronic components of integrated circuits. In addition, vertical capacitors may be formed by etching the features of the wall of the capacitor in the capacitor dielectric and forming the remaining capacitor structure around the etched dielectric. Typically, the capacitance of the capacitor is proportional to the surface area of the wall of the capacitor etched in the dielectric material.

In plasma etching, a glow discharge is used to produce reactive species, such as atoms, radicals, and/or ions, from relatively inert gas molecules in a bulk gas, such as a fluorinated gas, such as $CF_4$, $CHF_3$, $C_2F_6$, $CH_2F_2$, $SF_6$, or other freons, and mixtures thereof, in combination with a carrier gas, such as Ar, He, Ne, Kr, $O_2$, or mixtures thereof. Essentially, a plasma etching process comprises: 1) reactive species are generated in a plasma from the bulk gas, 2) the reactive species diffuse to a surface of a material being etched, 3) the reactive species are absorbed on the surface of the material being etched, 4) a chemical reaction occurs that results in the formation of a volatile byproduct, 5) the byproduct is desorbed from the surface of the material being etched, and 6) the desorbed byproduct diffuses into the bulk gas.

As illustrated in drawing FIG. 4, an apparatus 200 used in the plasma etching process consists of an etching chamber 202 in electrical communication with a first AC (Alternating Current) power source 204. The etching chamber 202 further includes a pedestal 206 to support a semiconductor substrate 208 and an electrode 212 opposing the pedestal 206. The electrode 212 is in electrical communication with a second AC power source 214. The pedestal 206 has an AC power source 216. The electrode 212 and power source 214 may be an inductively coupled plasma source, a microwave plasma source, or any suitable type plasma source.

In the etching chamber 202, a plasma 222 is initiated and maintained by inductively coupling AC energy from the first AC power source 204 into an atmosphere of gases in the etching chamber 202 and the plasma 222 that comprises mobile, positively and negatively charged particles and reactive species. An electric field develops in a sheath layer 224 around the plasma 222, accelerating charged species (not shown) toward the semiconductor substrate 208 by electrostatic coupling.

To assist with the etching, the potential difference between the plasma 222 and the semiconductor substrate 208 can be modulated by applying an oscillating bias power from the pedestal power bias source 216 to the pedestal 206, as illustrated in drawing FIG. 5A (showing the voltage profiles during such oscillation). During the positive voltage phase 232, the substrate collects electron current from electrons that have enough energy to cross the plasma sheath layer 224 (see drawing FIG. 4) having a plasma potential 236 (see drawing FIG. 5A). The difference between the instantaneous plasma potential and the surface potential defines the sheath potential voltage drop 238 (FIG. 5B). Since the plasma potential is more positive than the surface potential, this drop has a polarity that retards electron flow. Hence, only electrons with energy larger than this retarding potential are collected by the substrate. During the negative voltage phase 234, positive ions are collected by the substrate. These ions are accelerated by the sheath voltage drop 238 and strike the substrate.

However, it is known that the plasma etch results, including profile modification, can occur if the features are charged enough to modify the trajectories of the ions and electrons that are injected into these features.

Illustrated in drawing FIG. 6 is the phenomena of electrical charging on a semiconductor device in the process of a plasma etch. A material layer 244 to be etched is shown layered over a semiconductor substrate 242. A patterned photoresist layer 246 is provided on the material layer 244 for the etching of a via. During the plasma etching process, the patterned photoresist layer 246 and material layer 244 are bombarded with positively charged ions 248 and negatively charged electrons 252. This bombardment results in a charge distribution being developed on the patterned photoresist layer 246 and/or the semiconductor substrate 242. This charge distribution is commonly called "feature charging."

In order for feature charging to occur, the positively charged ions 248 and the negatively charged electrons 252 must become separated from one another. The positively charged ions 248 and negatively charged electrons 252 become separated by virtue of the structures being etched and by the differences in directionality and energy between the positive ions and electrons as they approach the feature being etched. As the structure (in this example, a via 254) is formed by etching, the aspect ratio (height to width ratio) becomes greater and greater. During plasma etching, the positively charged ions 248 are accelerated toward the patterned photoresist layer 246 and the material layer 244 in a relatively perpendicular manner, as illustrated in drawing FIG. 7 by the arrows adjacent positively charged ions 248. The negatively charged electrons 252, however, are less affected by the AC power bias source at the semiconductor substrate 242 and, thus, move in a more random isotropic manner, as depicted in drawing FIG. 8 by the arrows adjacent negatively charged electrons 252. This results in an accumulation of a positive charge at a bottom 256 of via 254 because, on average, positively charged ions 248 are more likely to travel vertically towards the substrate 242 than are negatively charged electrons 252. Thus, any structure with a high enough aspect ratio tends to charge more negatively at photoresist layer 246 and an upper portion of the material layer 244 to a distance A (i.e., illustrated with "−" indicia) and more positively at the via bottom 256 and the sidewalls of the via 254 proximate the via bottom 256 (i.e., illustrated with "+" indicia).

As shown in drawing FIG. 7, the negatively charged sidewalls of the top of the opening deflects the positively charged ions 248 in trajectories towards the sidewalls. In addition, the positively charged via bottom 256 also decreases the vertical component of the ion velocity and therefore increases the relative effect of initial deflection. The deflection results in ion bombardment of the sidewalls 258 proximate the via bottom 256. This can generate a portion of the etched feature with a re-entrant profile, as shown in drawing FIG. 7. Such a profile can be useful in etching a number of films. For example, a re-entrant profile in a metal film can increase alignment tolerance to shorts to adjacent contacts by shrinking the size of the metal line as it meets the layer below it. In addition, a "bulge" can be etched into dielectric films such as borophosphosilicate glass (BPSG) with these ions. In this case, the feature charging causes a pileup of deflected ions at a location in the feature and some widening of the feature occurs.

As shown in drawing FIG. 8, the negatively charged photoresist layer 246 and the upper portion of the material layer 244 deflect the negatively charged electrons 252 away from entering the via 254 or slow the negatively charged electrons 252 as they enter the via 254, both caused by charge repulsion and both of which can change the etch profile. This type of phenomenon is commonly known as "electron shading."

Thus, it can be appreciated that it would be advantageous to develop an apparatus and a process of utilizing a plasma reactor that maximizes or adds a controllable effect of feature charging while using inexpensive, commercially available semiconductor device fabrication components and without requiring complex processing steps.

SUMMARY OF THE INVENTION

The present invention relates to an apparatus and method of reorienting electrons generated in a plasma reactor to minimize the electrons' ability to penetrate a feature and therefore reduce charging inside the feature.

One embodiment of the present invention comprises an etching chamber in electrical communication with a first power source. The etching chamber further includes a pedestal to support a semiconductor substrate and an electrode opposing the pedestal. The electrode is in electrical communication with a second power source. The pedestal is in electrical communication with an AC power source. The etching chamber includes a second electrode in electrical communication with a second AC power source. The pedestal is further in electric communication with a triggerable, high-speed switch. When triggered, the switch closes to short the pedestal to ground. The AC power source is preferably in electrical communication with the switch through a signal line.

As previously discussed, the potential difference between the plasma and the semiconductor substrate can be modulated by applying an oscillating power from the pedestal power source to the semiconductor substrate. During the positive voltage phase, the substrate collects electron current from electrons that have enough energy to cross the plasma sheath. The difference between the instantaneous plasma potential and the surface potential defines the sheath potential drop. Since the plasma potential is more positive than the surface potential, this drop has a polarity that retards electron flow. Hence, only electrons with energy larger than this retarding potential are collected by the substrate. During the negative voltage phase, positive ions are collected by the substrate. These ions are accelerated by the sheath voltage drop and strike the substrate. However, the present invention comprises the shorting of the pedestal, either in a symmetrical manner or nonsymmetrical manner, during the positive voltage phase (i.e., during the time the negatively charged electrons flow to the wafer). This results in an increase in the electric field that retards electron flow to the wafer.

Negatively charged electrons are less affected by the DC bias at the semiconductor substrate than are positively charged ions and, thus, move in a more random manner. However, the shorting of the pedestal, according to the present invention, alters the difference between the potential of the plasma and potential of the semiconductor substrate for a part of the positive voltage phase. In addition, because the surface potential is made more negative relative to the plasma potential, only higher energy electrons can overcome this increased potential barrier and reach the surface. This results in more charging and a bigger difference between the positive voltage at the bottom of the feature and the negative voltage at the top of the feature. This increases the feature charging effects. In other words, the shorting of the pedestal increases the role of feature charging on the etch results.

The triggerable, high-speed switch is preferably controlled by the power output of the AC power source. Thus, when the power output of the AC power source reaches a first predetermined level, a first signal is sent from the AC power source or from a sensor (not shown coupled with the AC power source) to the triggerable, high-speed switch via the signal line. When the first signal is received by the switch, the switch closes to short the pedestal to ground. A second signal is sent from the AC power source or from a sensor (not shown coupled with the AC power source) to open the switch, which discontinues the grounding of the pedestal. The second signal can be sent when power output of the AC power source reaches a second predetermined level, or after a predetermined duration of time passes.

Thus, the present invention is capable of providing a simple and controllable method of effecting the quality and efficiency of plasma etching and is easily implemented on most existing plasma reactors.

Although the examples presented are directed to the formation of an opening with a plasma etching apparatus, it is understood that the present invention may be utilized in a variety of feature-formation and plasma processes.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
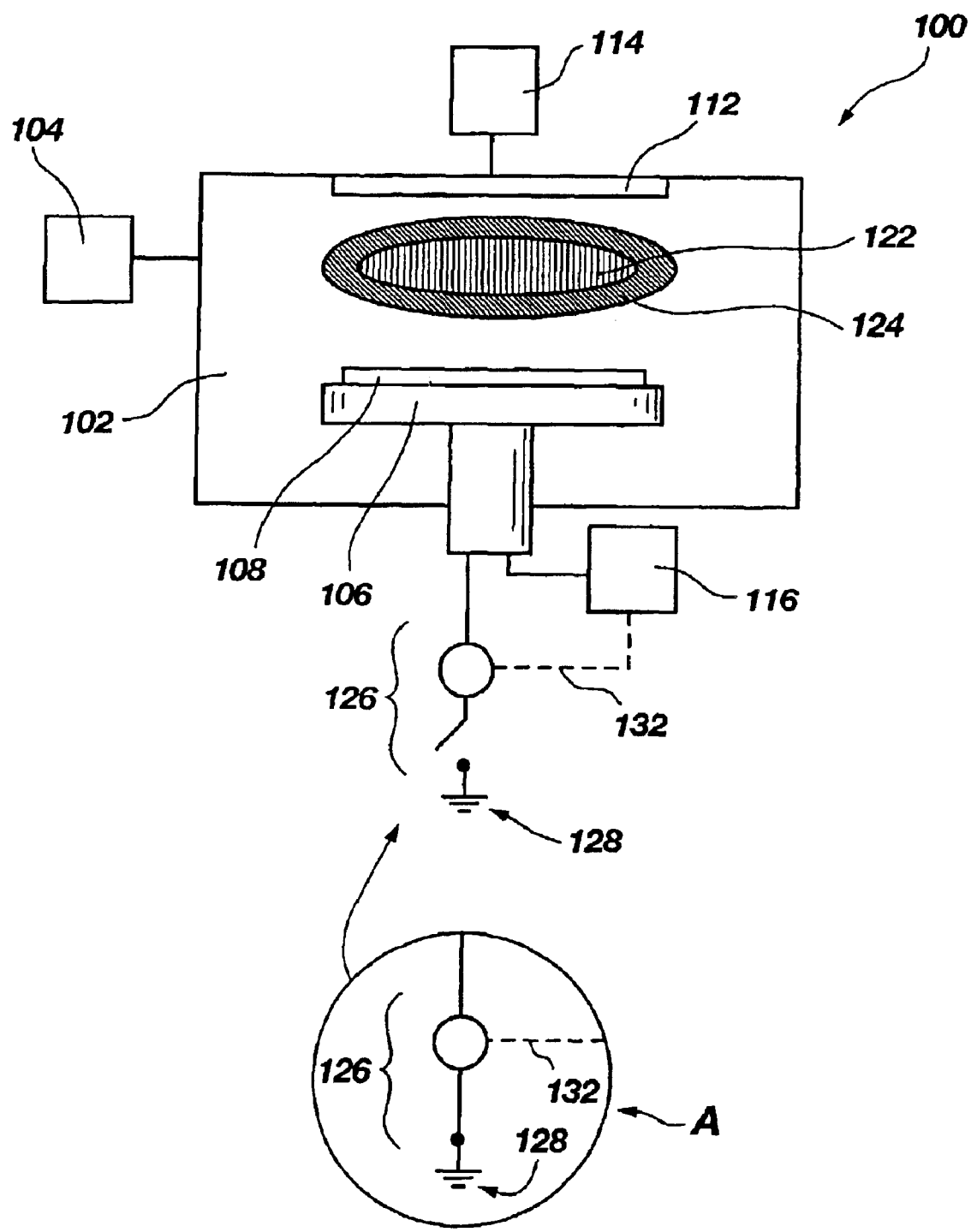
FIG. 1 is a schematic of a plasma etching apparatus according to the present invention.
Figure 2A:
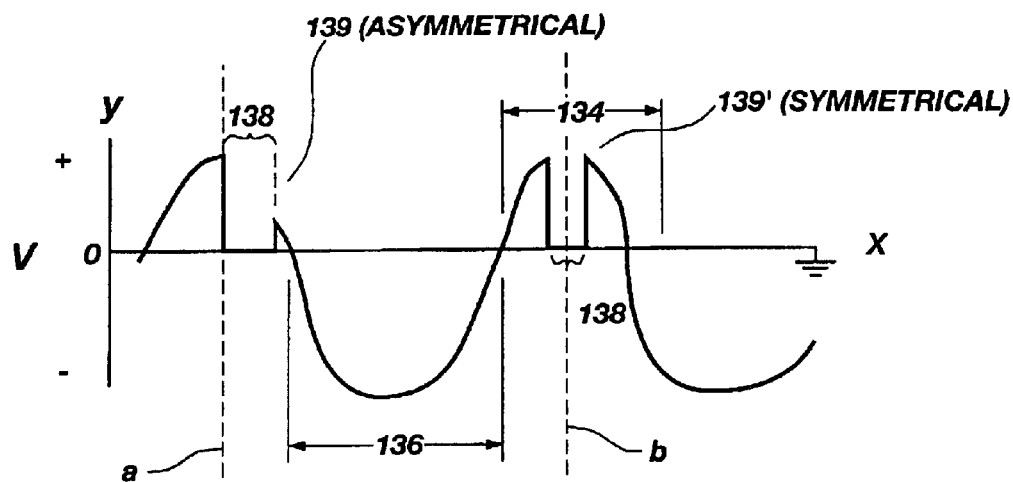
FIGS. 2A, 2B, and 2C are idealized graphs of an oscillating voltage profile, current profile, and plasma sheath voltage profile of a plasma etching apparatus pedestal according to the present invention.
Figure 2B:
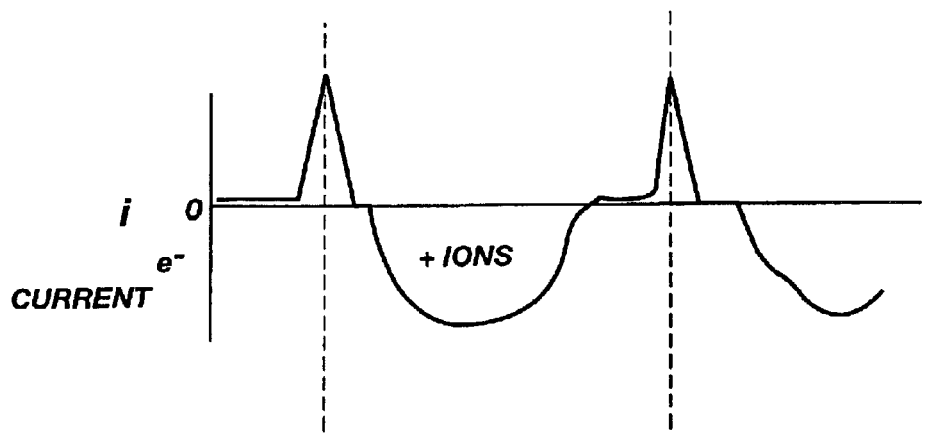
Figure 2C:
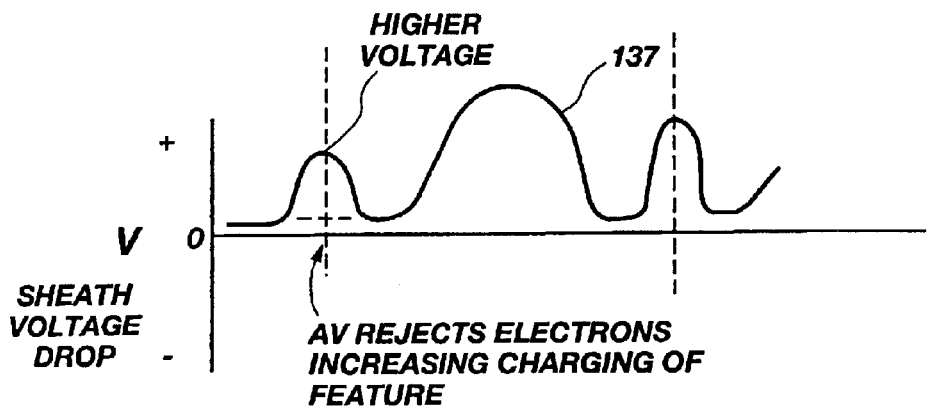
Figure 3:
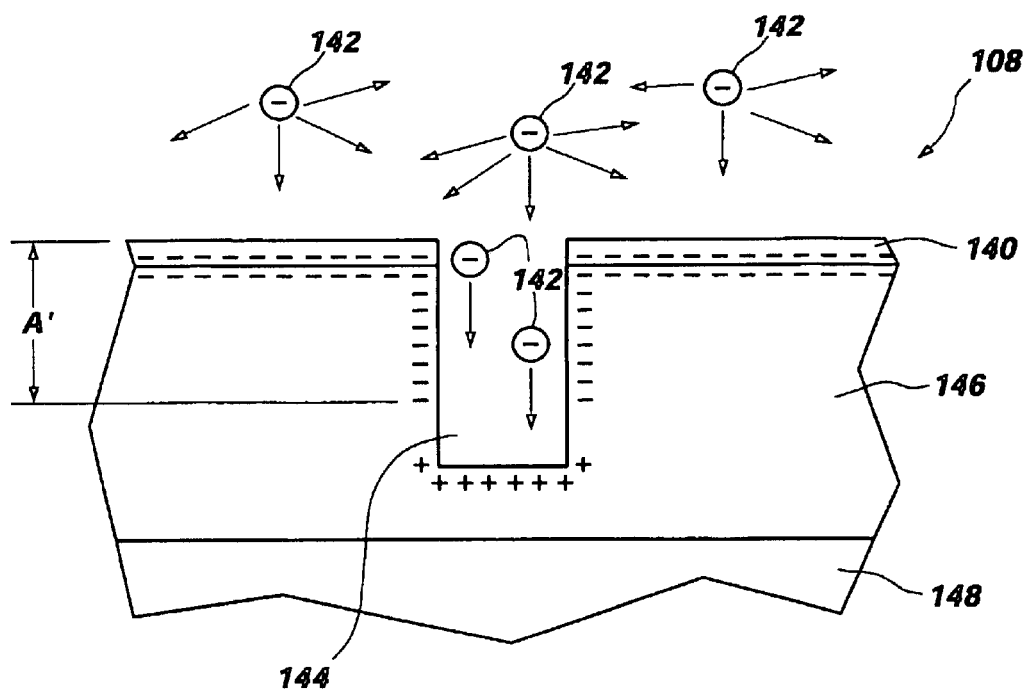
FIG. 3 is a cross-sectional view of a via during an etching process according to the present invention.
Figure 4:
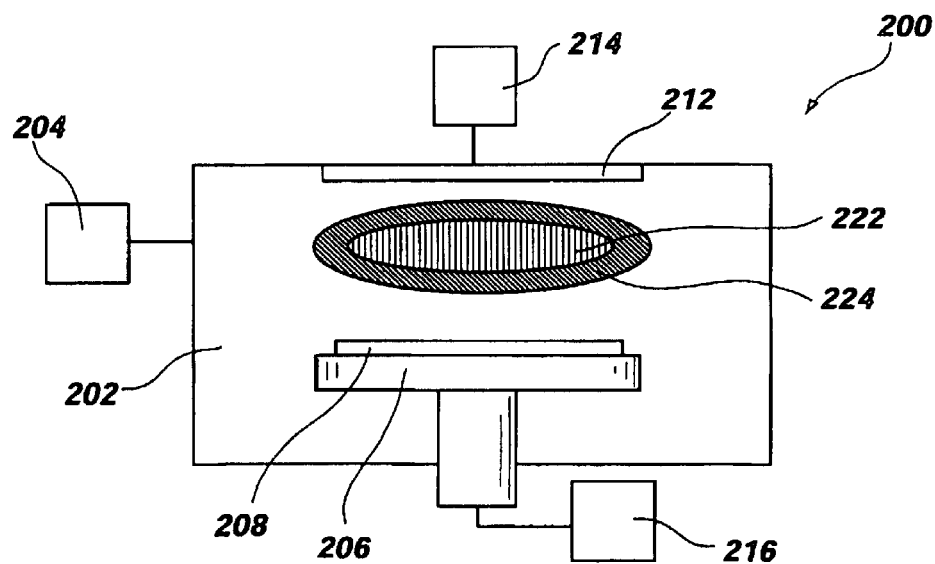
FIG. 4 is a schematic of a prior art plasma etching apparatus.
Figure 5A:
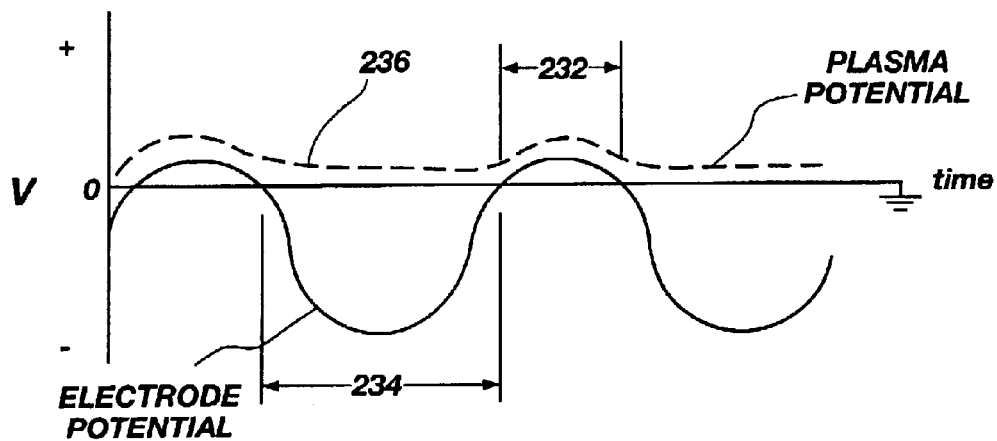
FIGS. 5A, 5B are idealized graphs of an oscillating voltage profile and plasma sheath voltage profile of prior art plasma etching apparatus pedestal of FIG. 4.
Figure 5B:
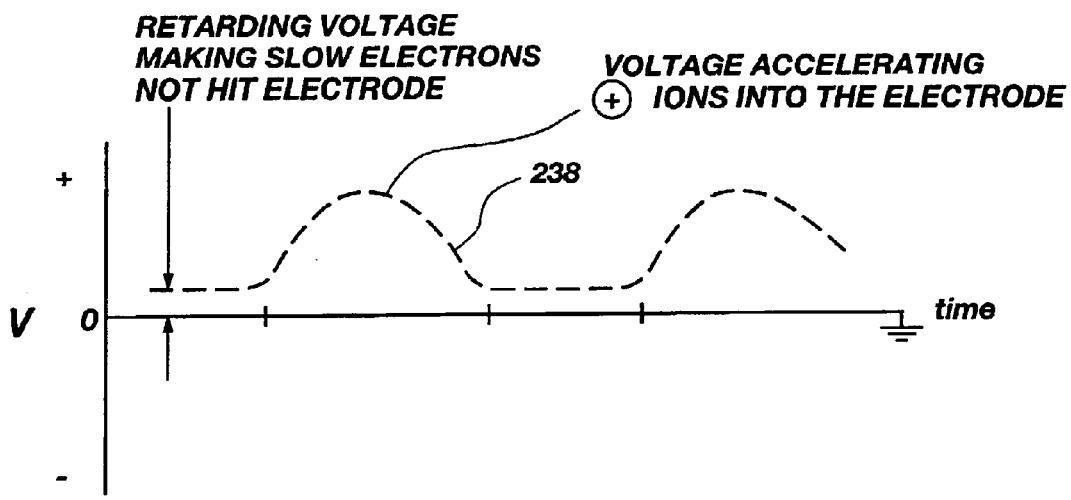

Referring to drawings FIGS. 1 through 3, illustrated are various schematics, views, and graphs of the present invention. It should be understood that the illustrations are not meant to be actual views of any particular semiconductor device, but are merely idealized representations that are employed to more clearly and fully depict the formation of contact interfaces in the present invention than would otherwise be possible. Additionally, elements common between drawing FIGS. 1 through 3 retain the same numerical designation.

As illustrated in drawing FIG. 1, one embodiment of an etching apparatus 100 of the present invention comprises an etching chamber 102 in electrical communication with a first power source 104, such as an AC power source, a microwave power source, or any suitable power source, etc. The etching chamber 102 further includes a pedestal 106 to support a semiconductor substrate 108 and an electrode 112 opposing the pedestal 106. The electrode 112, typically a coil or set of coils, is in electrical communication with a second power source 114. The pedestal 106 is in electrical communication with an AC pulsed power bias source 116. In general, the electrode 112 can also be a plasma source driven by microwave power, electron cyclotron resonance power, or capacitively coupled rf power. Multiple frequency capacitively coupled power plasma processing tools (such as a Lam Corporation, Fremont, Calif., etcher called "EXELAN®") are also described in drawing FIG. 1 wherein the dual-frequency supplies would simply use the switching circuit 126 (also referred to as "switch 126") on one of the two power supplies.

In the etching chamber 102, a plasma 122 is maintained by inductively coupling energy from the first power source 104 into the plasma 122, which comprises mobile, positively and negatively charged particles. An electric field, or bias voltage, develops in a sheath layer 124 around the plasma 122, accelerating the electrons and ions (not shown) toward the semiconductor substrate 108 by electrostatic coupling.

The pedestal 106 is further in electric communication with a triggerable, high-speed switch 126 interposed along an electrical path to ground 128. When triggered, the switch 126 closes to short the pedestal 106 to ground 128. The AC power source 116 is preferably in electrical communication with the switch 126 with a signal line 132.

As previously discussed, the potential difference between the plasma 122 and the semiconductor substrate 108 can be modulated by applying an oscillating bias power from the pedestal AC pulsed power source 116 to the semiconductor substrate 108, as illustrated in drawing FIGS. 2A, 2B, 2C (showing the voltage profile for the pedestal and plasma sheath as well as the current profile during such oscillation). During the positive voltage phase 134, the substrate collects electron current from electrons that have enough energy to cross the sheath. The difference between the instantaneous plasma potential and the surface potential defines the sheath potential voltage drop 137. Since the plasma potential is more positive than the surface potential, this drop has a polarity that retards electron flow. Hence, only electrons with energy larger than this retarding potential are collected by the substrate. During the negative voltage phase 136, positive ions are collected by the substrate. These ions are accelerated by the sheath voltage drop and strike the substrate. However, as also illustrated in drawing FIGS. 2A, 2B, 2C, the present invention comprises the shorting of the pedestal 106 during the positive voltage phase 134 (i.e., during the time the electrons flow to the wafer) for a duration of time 138. The shorting of the pedestal 106 during the positive voltage phase 134 may occur either asymmetrically 139 or symmetrically 139'. As illustrated in drawing FIGS. 2A, 2B, 2C, with particular reference to drawing FIG. 2A, the voltage profile has been illustrated as a displaced sine wave about the x-axis and y-axis. Although a displaced sine wave has been illustrated, the voltage could be supplied in any wave manner, displaced or not about the x-axis and y-axis. Further, as illustrated specifically with reference to drawing FIG. 2A, the asymmetrical shorting or grounding 139 of the pedestal 106 during the positive voltage phase 134 is shown as occurring for a duration of time 138 being displaced along the x-axis from the a-axis of drawing FIG. 2A, such a-axis extending through the peak of the positive voltage phase 134. However, the asymmetrical shorting or grounding 139 of the pedestal 106 during the positive voltage phase 134 could occur asymmetrically in any manner during the positive voltage phase 134 so long as the desired etching occurs. Additionally, the symmetrical shorting or grounding 139' of the pedestal 106 during the positive voltage phase 134 is illustrated as occurring for a duration of time 138 being displaced equally along the x-axis on either side (left or right) from the b-axis of drawing FIG. 2A, such a-axis extending through the peak of the positive voltage phase 134. However, the symmetrical shorting or grounding 139' of the pedestal 106 during the positive voltage phase 134 could occur symmetrically about the b-axis in any manner for any duration of time 138 so long as the desired etching occurs. Therefore, the voltage during the positive phase 134 of the electrical signal to the pedestal 106 during the closing of the switch 126 to short or ground the pedestal 106 may occur when the closing voltage is substantially higher, substantially lower or substantially equal to the voltage during the positive voltage phase 134 when the switch 126 is opened. Conversely, the opening voltage during the positive voltage phase of the electrical signal of the switch 126 to the pedestal 106 may occur when the opening voltage is substantially higher, substantially lower, or substantially equal to the voltage during the positive voltage phase 134 when the switch 126 is closed. In this manner, any desired asymmetrical or symmetrical shorting or grounding of the pedestal 106 may occur during the positive voltage phase 134 of the electrical signal.

Figure 6:
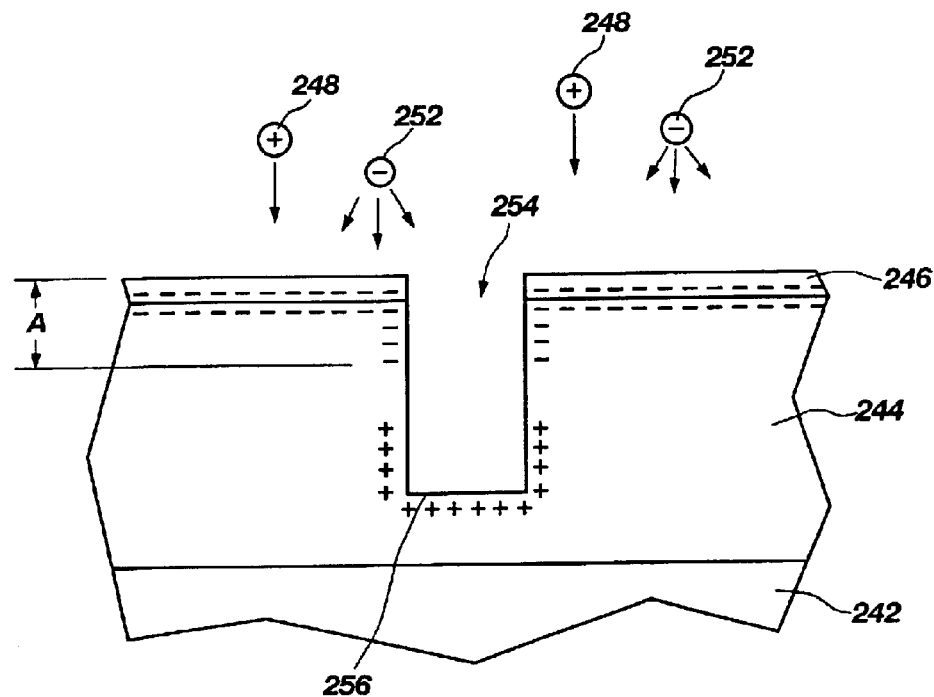
FIG. 6 is a cross-sectional view of a via during a prior art etching process that results in the phenomena on feature charging.
Figure 7:
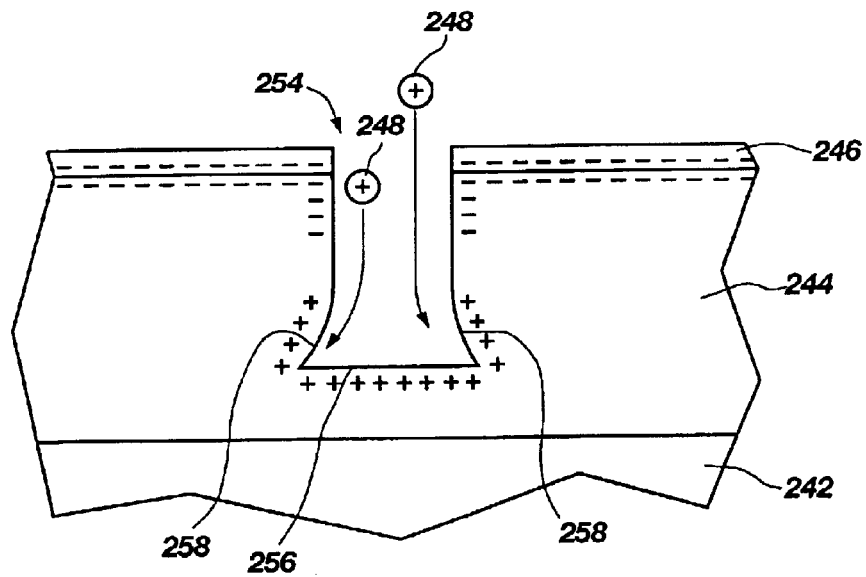
FIG. 7 is a cross-sectional view of a via during a prior art etching process wherein feature charging results in the deflection of positively charged ions away from the bottom of the via and toward the sidewalls of the via.
Figure 8:
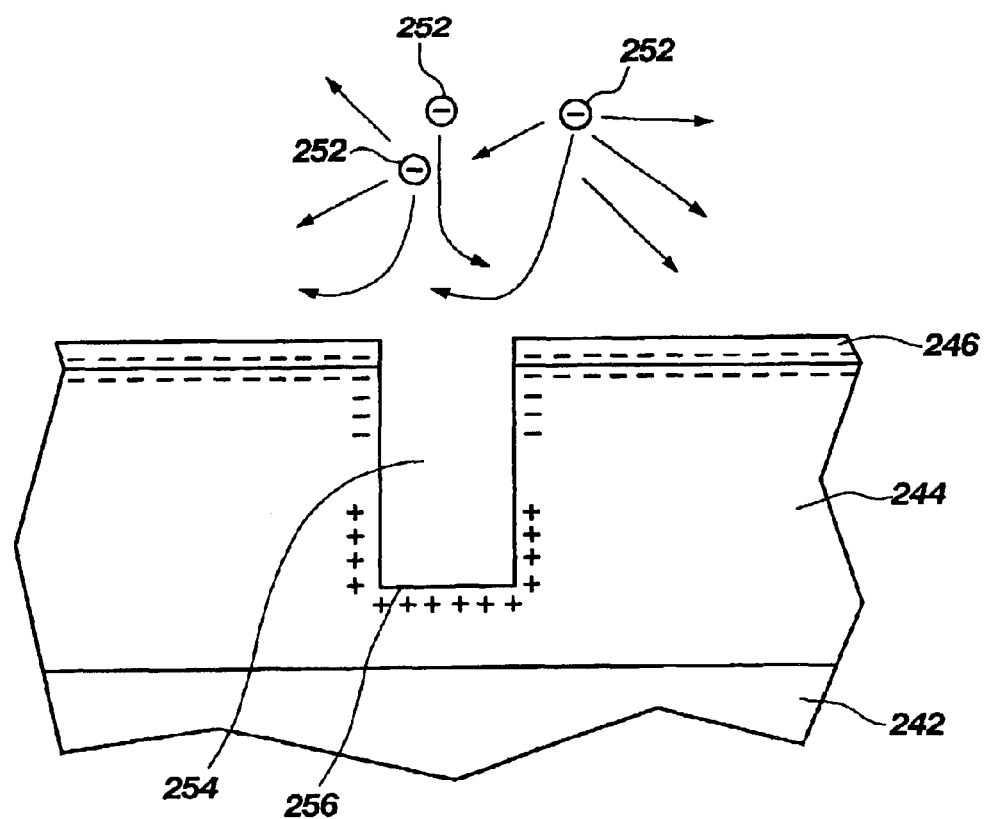
FIG. 8 is a cross-sectional view of a via during a prior art etching process wherein feature charging results in the deflection of negatively charged electrons away from entering the via or slows the negatively charged electrons as they enter the via.

As previously discussed and illustrated in prior art drawing FIG. 6, negatively charged electrons 252 are less affected by the AC bias at the semiconductor substrate than are positively charged ions and, thus, move in a more random manner, as depicted by the arrows adjacent negatively charged electrons 252. However, the shorting or grounding of the pedestal 106, according to the present invention, alters the difference between the potential of the plasma 122 and potential of the semiconductor substrate 108 for a part of the positive voltage phase 134, as shown in drawing FIGS. 2A, 2B, 2C.

Referring again to drawing FIG. 1, the triggerable, high-speed switch 126 is preferably controlled by the power output of the AC pulsed power source 116. Thus, when the power output of AC pulsed power source 116 reaches a first predetermined level, a first signal is sent from the AC pulsed power source 116 (or from a sensor (not shown) coupled with the AC pulsed power source 116) to the triggerable, high speed-switch 126 via the signal line 132. When the first signal is received by the switch 126, the switch 126 closes to a grounded position (see inset A of drawing FIG. 1) to short or ground the pedestal 106 to ground 128. A second signal is sent from the AC pulsed power source 116 (or from a sensor (not shown) coupled with the AC pulsed power source 116) to open the switch 126 to an open circuit position, as illustrated in FIG. 1, which discontinues the shorting or grounding of the pedestal 106. The second signal can be sent when power output of the AC pulsed power source 116 reaches a second predetermined level, or when a predetermined duration of time passes. Thus, the grounding can be controlled to occur at any point during the positive voltage cycle and for any duration to achieve the desired etching results for a particular semiconductor material. Referring to drawing FIG. 3, illustrated in a cross-sectional view of hole 144 being formed in a substrate 148 having a material layer 146 thereon having a layer of photoresist 140 thereon. Negatively charged electrons 142 are illustrated.

In using the present invention to etch typical dielectric material used in a semiconductor device, for a common IPS plasma etcher, sold by Applied Materials, the etcher would operate at a power level of approximately 800 watts having a power level bias of approximately 700 watts using a $CHF_3$ gas at a flow rate of approximately 22 sccm, the roof temperature of the etcher being independently controlled, and at a pressure level of approximately 20 mtorr. The roof temperature is set to approximately 140° C. and the ring temperature to approximately 200° C. with the bias frequency in the range of 1.7+/−0.2 MHZ. Under these conditions, the rf voltage at the wafer surface is estimated to be approximately in the range of 300 to 400 volts AC with the plasma having a potential below 50 volts at its peak.

In other instances, the present invention may be used to etch metal used in semiconductor devices, such as etching conductors in semiconductor devices. During the time that the conductor is etching, there is no feature charging. However, most metal etches finish on an insulator, including overetching. During this period, the bottom of the feature can charge up since it is an insulator, and the effects of feature charging can begin. For example, the conductor profile could be made re-entrant during the overetch if the feature charging is increased.

The present invention is particularly useful in the formation of high aspect ratio contact holes or apertures in dielectric material used in semiconductor devices. For instance, high aspect ratio contact holes or apertures in dielectric material may have a ratio of height to diameter of greater than 5:1 using the present invention.

Figure 9:
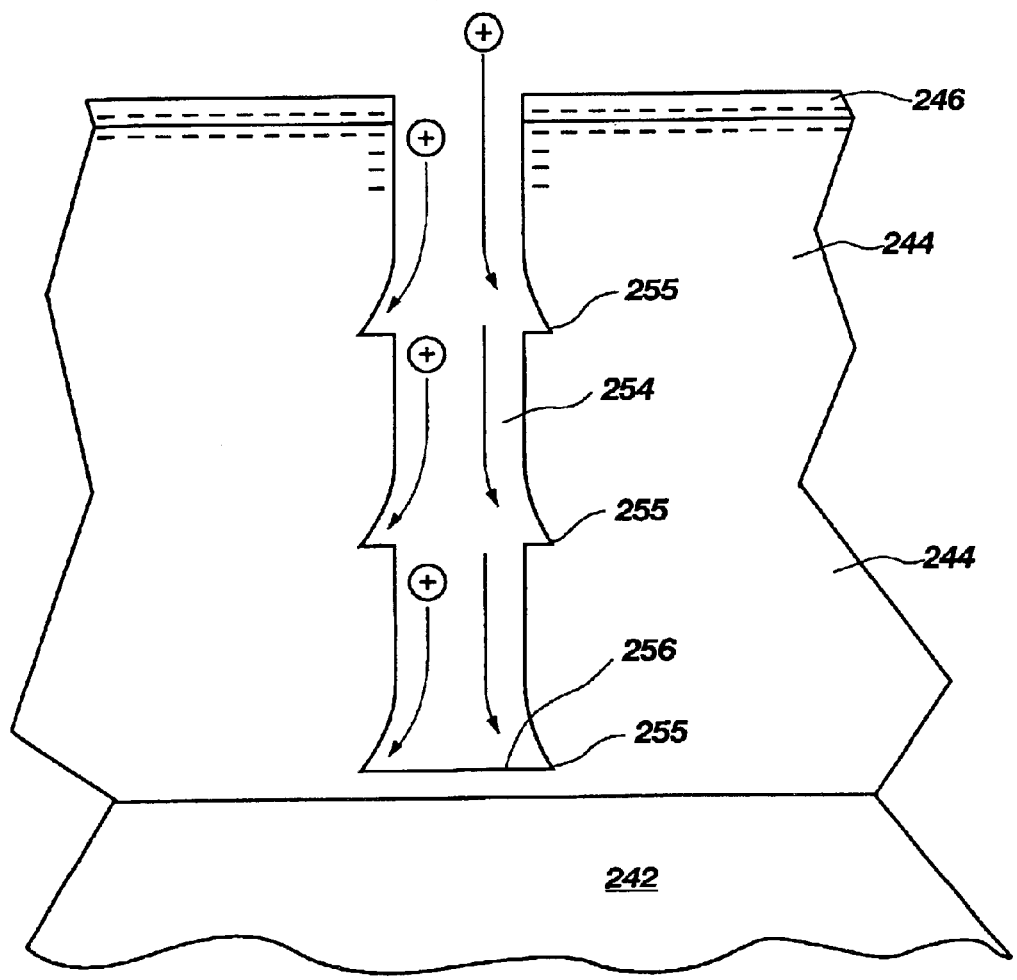
FIG. 9 is a cross-sectional view of a type of via formed by the present invention.

Additionally, if desired, an aperture 254, opening 254, via 254, or hole 254 may be formed having a plurality of bulges 255 therein using the present invention as illustrated in drawing FIG. 9. As illustrated, a high aspect ratio hole 254 is formed in a substrate 242 having a plurality of bulges 255 formed therein by the continual switching of the voltage during the operation of the etcher as described herein.

For instance, during the deposition of a dielectric into a high aspect ratio feature, the controlled increase in feature charging can be used to reduce ion energy to the bottom of the feature and vary the film deposition rate and film properties in the feature. For example, a fill could be made to form a bread-loaf shape of dielectric material at the top of the feature while having a low deposition rate inside the feature. This allows voids to be formed by increasing the feature charging during the deposition of the dielectric material.

Thus, the present invention is capable of providing a simple and controllable method of affecting the quality and efficiency of plasma etching and is easily implemented on most existing plasma reactors. Furthermore, although the examples presented are directed to the formation of a via, it is understood that the present invention may be utilized in a variety of feature formation and plasma processes.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A plasma reactor comprising a reactor chamber including:
   a pedestal for supporting a semiconductor substrate;
   an AC power source in electrical communication with the pedestal; and
   a first electrical path from ground to a switch, a second electrical path from the switch to the AC power source, and a third electrical path from the AC power source to the pedestal, and the switch being operable between an open position and a closed position such that when the switch is closed the pedestal is shorted to ground.

2. A plasma reactor comprising:
   a reactor chamber;
   a first AC power source in electrical communication with the reactor chamber;
   a pedestal disposed within the reactor chamber for supporting a semiconductor substrate thereon;
   an electrode disposed within the reactor chamber and opposing the pedestal;
   a second AC power source in electrical communication with the electrode; and
   a first electrical path from ground to a switch, a second electrical path from the switch to the first AC power source, and a third electrical path from the first AC power source to the pedestal, the paths being absent of capacitance, and the switch being operable between an open position and a closed position.

* * * * *

UNITED STATES PATENT AND TRADEMARK OFFICE
CERTIFICATE OF CORRECTION

PATENT NO. : 7,059,267 B2
APPLICATION NO. : 10/219841
DATED : June 13, 2006
INVENTOR(S) : Chuck E. Hedberg and Kevin G. Donohoe It is certified that error appears in the above-identified patent and that said Letters Patent is hereby corrected as shown below:

On the title page section ( 56 ):
Reference Cited:

OTHER PUBLICATIONS
PAGE 2, COLUMN 2, LINE 16,   change "Ai-Si-Cu" to --Al-Si-Cu--

Signed and Sealed this

Sixth Day of November, 2007

JON W. DUDAS
*Director of the United States Patent and Trademark Office*